(12) United States Patent
Chua et al.

(10) Patent No.: US 7,674,562 B2
(45) Date of Patent: *Mar. 9, 2010

(54) ANGLED-WEDGE CHROME-FACE WALL FOR INTENSITY BALANCE OF ALTERNATING PHASE SHIFT MASK

(75) Inventors: Gek Soon Chua, Singapore (SG); Sia Kim Tan, Singapore (SG); Qunying Lin, Singapore (SG); Cho Jui Tay, Singapore (SG); Chenggen Quan, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 1065 days.

This patent is subject to a terminal disclaimer.

(21) Appl. No.: 11/297,532

(22) Filed: Dec. 7, 2005

(65) Prior Publication Data

US 2007/0128527 A1 Jun. 7, 2007

(51) Int. Cl.
*G03F 1/08* (2006.01)
*G03F 1/14* (2006.01)
(52) U.S. Cl. ............................. 430/5; 216/12
(58) Field of Classification Search ............ 430/5; 216/12
See application file for complete search history.

(56) References Cited

U.S. PATENT DOCUMENTS

| 5,281,500 | A | 1/1994 | Cathey |
| 5,322,748 | A * | 6/1994 | Watakabe et al. ............... 430/5 |
| 5,487,962 | A | 1/1996 | Rolfson |
| 5,514,500 | A | 5/1996 | Ham |
| 6,410,191 | B1 | 6/2002 | Nistler |
| 6,458,495 | B1 | 10/2002 | Tsai |
| 6,531,250 | B2 | 3/2003 | Kim |
| 6,534,223 | B1 | 3/2003 | Yang |
| 6,627,359 | B2 | 9/2003 | Kokubo |
| 6,660,649 | B2 | 12/2003 | Dao et al. |
| 6,720,114 | B1 | 4/2004 | Winder et al. |
| 7,384,714 | B2 * | 6/2008 | Tan et al. ....................... 430/5 |
| 2001/0009745 | A1 | 7/2001 | Kim |
| 2002/0058188 | A1 * | 5/2002 | Iwasaki et al. ................. 430/5 |
| 2004/0073884 | A1 | 4/2004 | Kroyan |
| 2004/0180267 | A1 | 9/2004 | Tejnil |

* cited by examiner

*Primary Examiner*—Mark F Huff
*Assistant Examiner*—John Ruggles
(74) *Attorney, Agent, or Firm*—Horizon IP Pte Ltd (57) ABSTRACT

A method for forming a phase shift mask is presented. The method includes providing a substrate including a transparent material having first, second and third regions, the third region being disposed between the first and second regions. The method also includes forming a light reducing layer on a first major surface of the substrate. The light reducing layer is patterned to form a patterned light reducing layer having sidewalls defining openings to expose the first and second regions. The patterned light reducing layer is processed to transform the sidewalls of the patterned light reducing layer to angled sidewalls having an angle of less than 90° from a plane of the first major surface of the substrate. The angled sidewalls improve intensity balance of an image-formed by light-transmitted through the mask.

9 Claims, 10 Drawing Sheets

SSCAAM: Sloped Sidewall Chrome Alternating Aperture Mask

Dual-trench Sloped Sidewall Chrome

Single-trench with undercut

Dual-trench Sloped Sidewall Chrome with undercut

ANGLED-WEDGE CHROME-FACE WALL FOR INTENSITY BALANCE OF ALTERNATING PHASE SHIFT MASK

BACKGROUND OF INVENTION

1) Field of the Invention

This invention relates generally to structures and method of making circuit fabrication masks and more particularly some embodiments relate to the structures and methods of making of phase shifting circuit fabrication masks.

2) Description of the Prior Art

Improvements in photolithography have increased the density and enhanced the performance of semiconductor devices by shrinking integrated circuits (ICs). As described by the Rayleigh criterion, the minimum critical dimension (CD) which can be resolved by a wafer stepper is directly proportional to the wavelength of the illumination source and inversely proportional to the numerical aperture (NA) of the projection lens. However, diffraction tends to degrade the aerial image when the CD becomes smaller than the actinic wavelength. The actinic wavelength is the wavelength of light at which a mask is used in a wafer stepper to selectively expose photoresist coated on a substrate, such as a Silicon wafer. As needed, a resolution enhancement technique (RET), such as a phase-shifting mask (PSM), may be used to achieve a wider process latitude. Unlike a binary mask that only uses Chrome to control the amplitude of light transmitted through a quartz substrate, a PSM further modulates the phase of light to take advantage of destructive interference to compensate for the effects of diffraction.

An alternating PSM (AltPSM) is a type of PSM that is particularly helpful in improving contrast when patterning very small CDs, such as the gate length of a transistor in a device. AltPSM introduces a phase shift of 180 degrees between the light transmitted through adjacent clear openings so destructive interference can force the amplitude between the two images to zero. A phase shift of 180 degrees is implemented by creating a difference in the optical path lengths through adjacent openings in an opaque layer, such as Chrome. A subtractive process may be used to etch a trench into the quartz substrate in alternate openings. However, incident light may scatter off the sidewalls and bottom corners of the etched trench and cause an imbalance in the aerial image that varies as a function of focus. Such a waveguide effect may be manifested as a CD error and a placement error.

The intensity and phase in the aerial image of an AltPSM may be balanced in various ways. A selective biasing approach enlarges the CD of the etched opening relative to the unetched opening to balance the aerial image. An etchback approach undercuts the edges of the chrome in both openings to balance the aerial image. A dual-trench approach etches a deep trench in the phase-shifted opening and a shallow trench in the non-phase-shifted opening to balance the aerial image.

The basic concept of increasing the resolution of a lithographic image is to modify the optical phase of the mask transmission. In an alternating PSM, alternating areas of chrome and 180 degree-shifted quartz are employed to form features on the wafer. Contrast is increased because the light diffracted into the nominally dark area will interfere destructively with the light diffracted from the clear area. The AltPSM is the "strongest" PSM technology and can improve the resolution of a given wafer exposure system by approximately 40%.

The problem of aerial image intensity imbalance through focus with AltPSM has been well-documented. One known solution for the intensity imbalance issue is to provide undercuts beneath the chrome and to bias (i.e., to thin) the trench chrome opening. However, undercuts and biasing limit the minimum chrome size and hence contributes to the chrome peeling issue.

Figure 9:
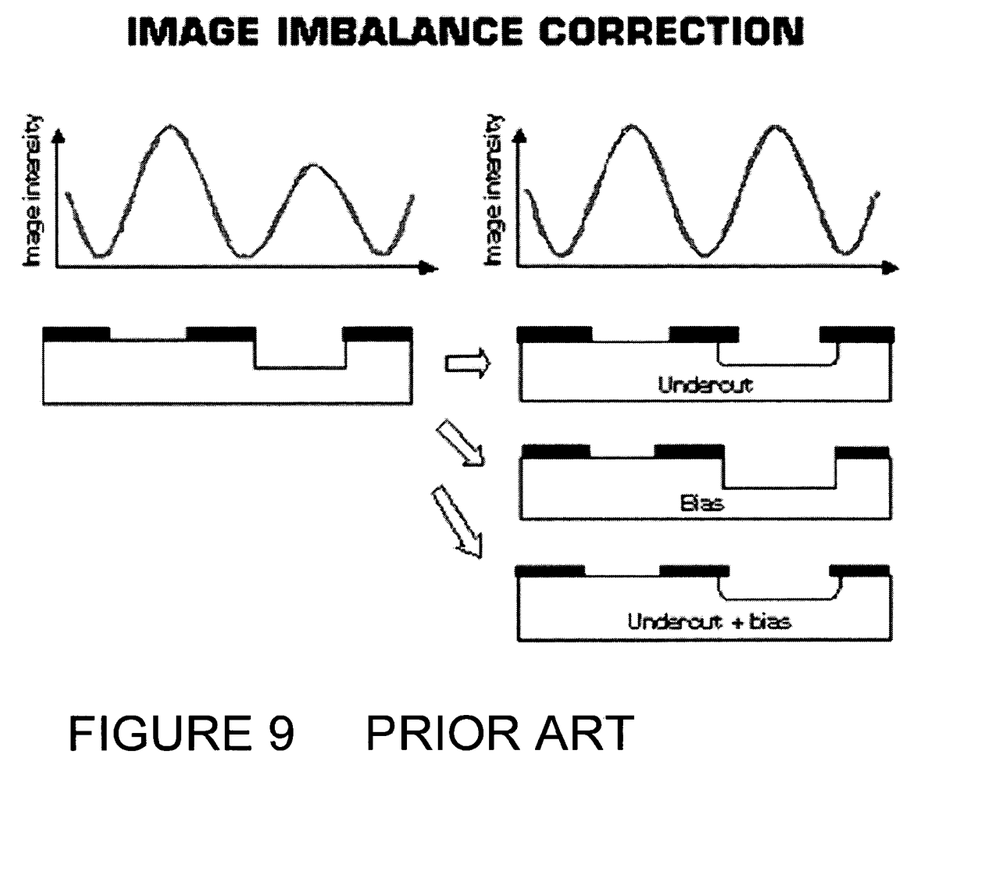
FIG. 9 shows some examples of the methods used to correct the image imbalance according to the prior art.

FIG. 9 shows some examples of the methods used to correct the image imbalance. The graph on the left shows the intensity imbalance for the PSM (shows below on the left.). The graph on the right shows improved image balance. Below are 3 examples of methods to improve; 1) undercut, 2) bias and 3) undercut an bias.

The apparently more relevant technical developments in the patent literature can be gleaned by considering the following patents.

U.S. Pat. No. 6,531,250: Kim and U.S. 20010009745A1: Kim—Half tone phase shift mask having a stepped aperture-Half-tone phase shift mask used in forming predetermined pattern of semiconductor integrated circuits, includes light-transmitting phase shift pattern defining stepped aperture.

U.S. Pat. No. 5,514,500: Ham—Half-tone type phase shift mask and method for fabricating the same—Mfr. of half-tone type phase shift masks—by forming phase shift layer on transparent substrate, forming light screen on phase shift layer, selectively etching light screen and phase shift layer to form pattern. The chrome pattern has a step.

U.S. Pat. No. 5,281,500: —Cathey, David A.; —Method of preventing null formation in phase shifted photomasks—Preventing zero formation in phase-displacement photoresist masks—by proving a transparent substrate with dark features in relief, and delimiting at least one end of upwardly-projecting clear phase displacement features, etc.

U.S. Pat. No. 5,487,962: —Rolfson, J. Brett; —Method of chromeless phase shift mask fabrication suitable for auto-cad layout—: Chrome-less phase-shift masks suitable for auto CAD layout—comprising raised shifters formed with vertical edge and tapered edge.

U.S. 20040073884A1: —Kroyan—Phase shifting mask topography effect correction based on near-field image properties—Image intensity imbalance correction method for phase shifting mask in e.g. deep UV lithography, involves computing near-field image for pair of shifters, based on which bias is determined for phase shifters. —The patent shows undercuts for an alt-psm.

U.S. Pat. No. 6,458,495: —Tsai, Wilman;—Transmission and phase balance for phase-shifting mask—Phase-shifting mask with balanced transmission and phase, has trenches with vertical sidewall profiles which are retrograde U.S. Pat. No. 6,627,359: —Kokubo, Haruo—Phase-shift photomask manufacturing method and phase-shift photomask—Phase-shift photomask manufacture for forming resist pattern on wafer, involves wet-etching light transmission section on substrate to set depth of recesses formed on section to satisfy specific relationship.

U.S. Pat. No. 6,410,191: —Nistler, John L.—Phase-shift photomask for patterning high density features. —Phase-shift photomask for patterning high density features and manufacture. The phase shifting region includes sloped sidewalls having a slope of less than about 85°.

SUMMARY OF THE INVENTION

The embodiments of the present invention provides a structure and a method of manufacturing a mask which is characterized as follows.

An example embodiment is a mask comprising:

a substrate having a first region, a second region and a third region; the third region positioned between the first region and the second regions; the substrate has a first surface;

an light reducing layer over the substrate having a first opening over the first region and a second opening over the second region; the first opening and the second opening having light reducing layer sidewalls;

the sidewalls of the light reducing layer are slanted at an angle less than 90 degrees with the plane of the top surface of the substrate.

Another example embodiment is a method for forming a mask comprising:

a) forming an light reducing layer over a substrate;
  (1) a substrate having a first region, a second region and a third region; the third region position between the first region and the second regions; the substrate has a first surface;
  (2) the light reducing layer has a first opening over the first region and a second opening over the second region; the first opening and the second opening defined by the light reducing layer sidewalls;
    (a) the sidewalls of the light reducing layer have a sidewall angle with the plane of the top surface of the substrate; the sidewall angle is about 90 degrees;
b) forming a first trench in the first region;
c) etching the light reducing layer sidewalls to make the sidewall angle less than 90 degrees.

Additional example embodiments are further described in the claims as filed and amended during prosecution and in the specification below.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a mask according to the present invention and further details of a process of fabricating such a mask in accordance with the present invention will be more clearly understood from the following description taken in conjunction with the accompanying drawings in which like reference numerals designate similar or corresponding elements, regions and portions and in which:

FIGS. 6A, 6B, 6C and 6D show graphs of (a) image intensity vs location for the best focus and (b) (a) image intensity vs location for the best focus and Focus at−0.2 microns for:

(1) single trench PSM with straight trench sidewalls. (anisotropic trench etch)

(2) single trench PSM with curved trench sidewalls. (isotropic trench etch)

(3) single undercut trench PSM (anisotropic+ isotropic trench etch)

(4) the embodiment's angled chrome sidewall mask.

DETAILED DESCRIPTION OF THE NON-LIMITING EXAMPLE EMBODIMENTS

The example embodiments of the present invention will be described in detail with reference to the accompanying drawings. The example embodiments provide structures and methods of forming a mask used in semiconductor device manufacturing.

B. Introduction

FIG. 9 shows some prior art examples of the methods used to correct the image imbalance in phase shift masks (PSM). The graph on the left shows the intensity imbalance for the PSM (shows below on the left.). The graph on the right shows improved image balance. Below are 3 examples of methods to improve; 1) undercut, 2) bias and 3) undercut an bias.

Figure 1:
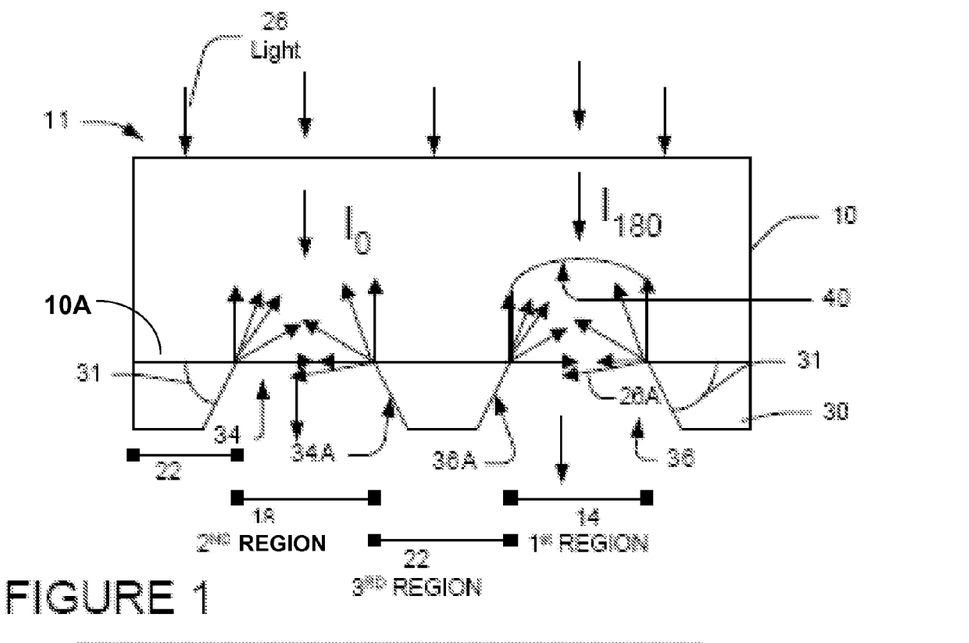
FIG. 1 shows a cross sectional view of an example embodiment of an mask with opaque layer with sloped sidewall openings according to an example embodiment of the present invention.

Some of the example embodiments can help correct the image imbalance in phase shift masks by using an opaque or half tone layer that has sloped face sidewalls (e.g., angled—wedge face). FIG. 1 shows an example of a phase shift masks by using an opaque or half tone layer having sloped face sidewalls.

Terms:

light reducing layer—a layer that reduces the amount of light passing through. A light reducing layer can be a half tone (e.g., translucent) or an opaque layer (e.g., chrome).

C. Mask with Opaque Layer with Sloped Sidewall Openings

An example embodiment of a mask used in semiconductor manufacturing is shown in FIG. 1. FIG. 1 shows a cross sectional view of an Mask with light reducing layer 30 (e.g., opaque or half tone layer 30) with sloped sidewall openings.

In the description below the light reducing layer 30 is referred to as a opaque layer 30. However, layer 30 can be a light reducing layer 30 such as a opaque or half tone layer 30.

The mask 11 comprises: a substrate 10 having a first region 14, a second region 18 and a third region 22. The third region 22 is positioned between the first region 14 and the second regions 18.

The substrate 10 has a first surface 10A that an opaque layer (e.g., light shielding layer) is formed over.

A opaque layer 30 is formed over the substrate 10. The opaque layer has a first opening 36 over the first region 14 and a second opening 34 over the second region 18. The first opening 36 and the second opening 34 are defined by opaque layer sidewalls 36A 34A, respectively.

The sidewalls 34A 36A of the opaque layer are slanted at an sidewall angle 31 less than 90 degrees with the plane of the top surface of the substrate.

The sidewalls of the opaque layer are slanted at an angle 31 with the plane of the top surface of the substrate (sidewall angle) between 5 and 89 degrees and more preferably between 30 and 60 degrees.

The openings are smallest at the first surface and the opening get wider at the top of the opaque layer.

In an option, light 26 transmitted through the first region 14 and the second region 18 are about 180 degrees out of phase.

Light transmitted through the first region has a first phase shift and light transmitted through the second region has a second phase shift. The first phase shift is preferably about 180 degrees from the second phase shift. The first region can be referred to as a unshifted region and the second region can be referred to as a phase shifted region.

In an option (single trench PSM) shown in FIG. 1, the first region 14 preferably comprises a first trench 40.

Figure 3A:
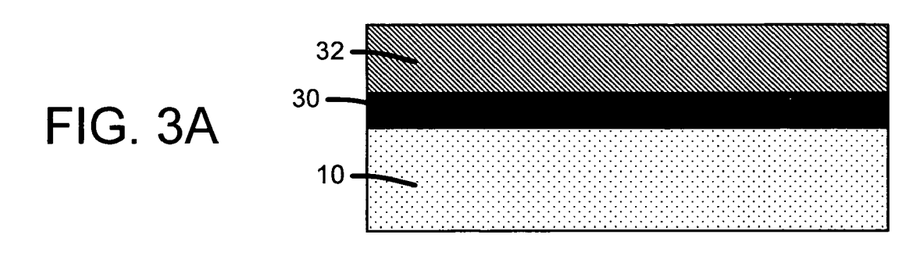
FIGS. 3A to 3G show an example method for forming a mask having slanted opaque layer sidewall according to an example embodiment of the present invention.
Figure 3B:
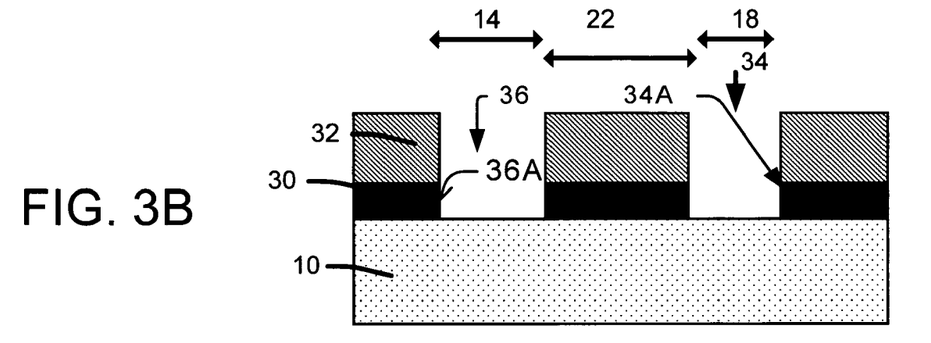
Figure 3C:
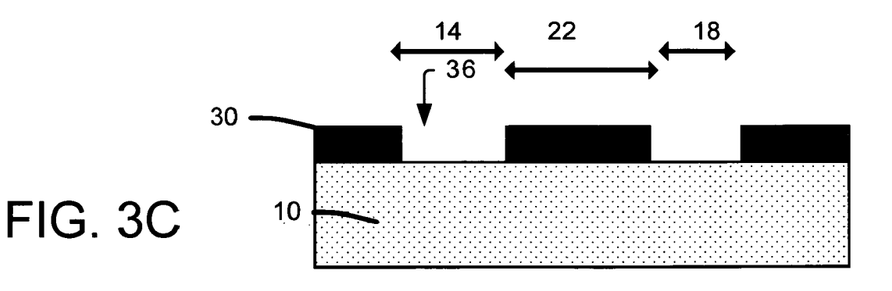
Figure 3D:
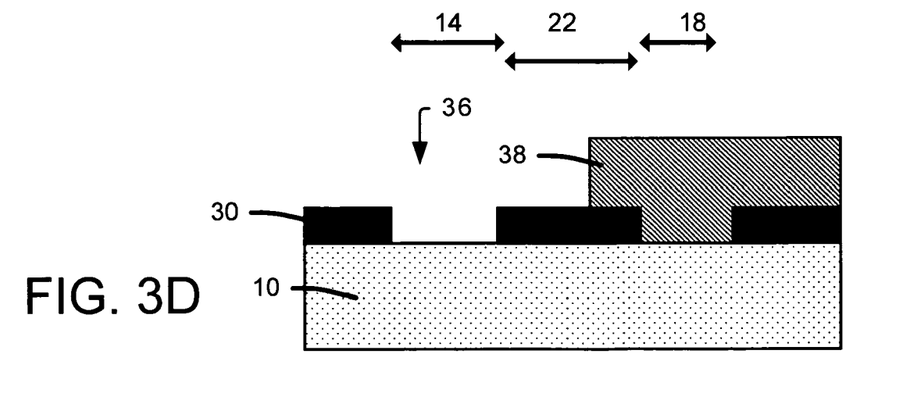
Figure 3E:
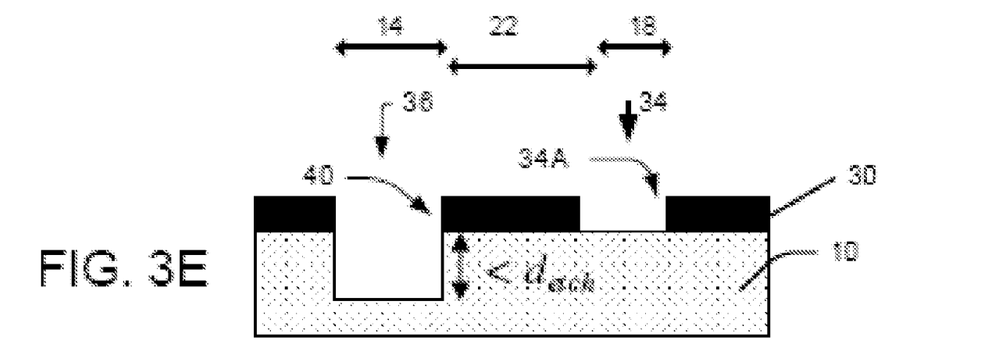
Figure 3F:
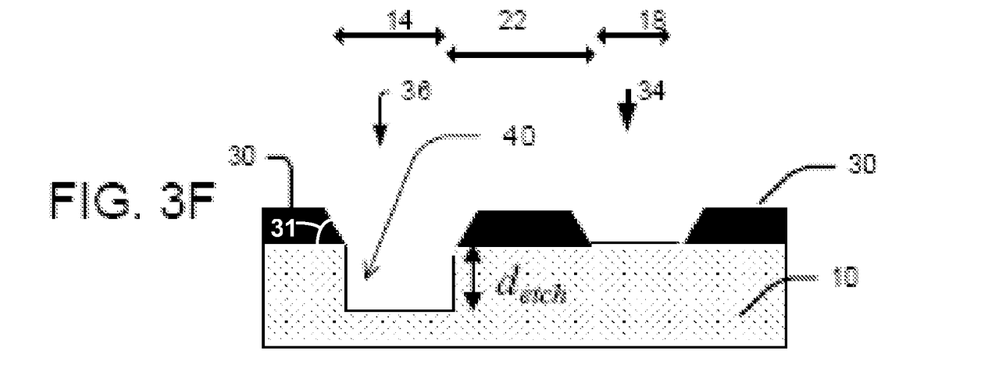
Figure 3G:
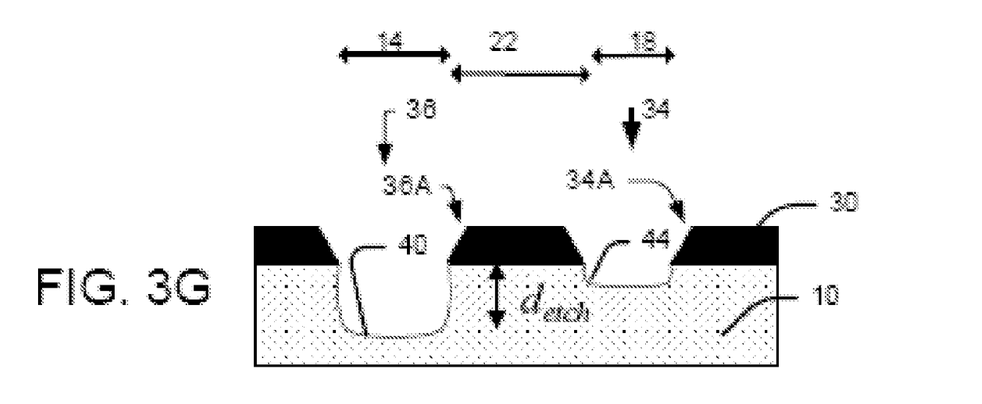

In another option (dual trench PSM) shown in FIG. 3G, the first region 14 comprises a first trench 40 and the second region 18 comprises a second trench 44. The light passing thru the first and second trenches is preferably about 180 degrees out of phase.

D. Some Explanation for Opaque Layers with Sloped Sidewall Openings

FIG. 1 shows light 26A diffracted off the corner to the opaque layer at different angles.

From FIG. 1, we see that the most possible (We choose our study at 180 degrees diffraction angle (θ) because the optical path for any two nearest opaque layer sidewall is the shortest, and thus would determine its phase and whether the interference will be constructive or destructive; not because it is the largest diffraction angle) diffraction angle for optical interference between two nearest opaque layer sidewalls is 180 degrees(θ). At 180 degrees diffraction angle, the optical path for any two nearest feature edges is the shortest. To achieve a balanced aerial image intensity, to $I_0 = I_{180}$. (balanced aerial image intensity is defined when light 26 transmitted thru the first region 14 and the second region 18 are about 180 degrees ($\phi$)$\hat{0}\hat{0}$ out of phase and of the same intensity)

**Where θ is the diffraction angle. 0 deg refer to the angle where the quartz interfaces with the chrome boundary towards the primary chrome feature. 90 deg refer to the direction perpendicular to the quartz surface into the quartz, away from the chrome. 180 deg refer to angle of the shortest displacement (distance) of the adjacent chrome feature. Hence the maximum is 360 deg.
^^where φ refers to the phase difference of the light reference to the phase angle passing through the unetched quartz surface.

In typical use, light 26 is passed through the mask 11 by passing thru a second (e.g., top) side of the substrate 10 and out the first surface 10A (bottom) side of the substrate 10 through the openings 34 and 36 in the opaque layer 30. The light shines on a photoresist to expose a pattern on the photoresist.

E. Plane Diffraction at a Wedge (Chrome Sidewall Openings)

Figure 2:
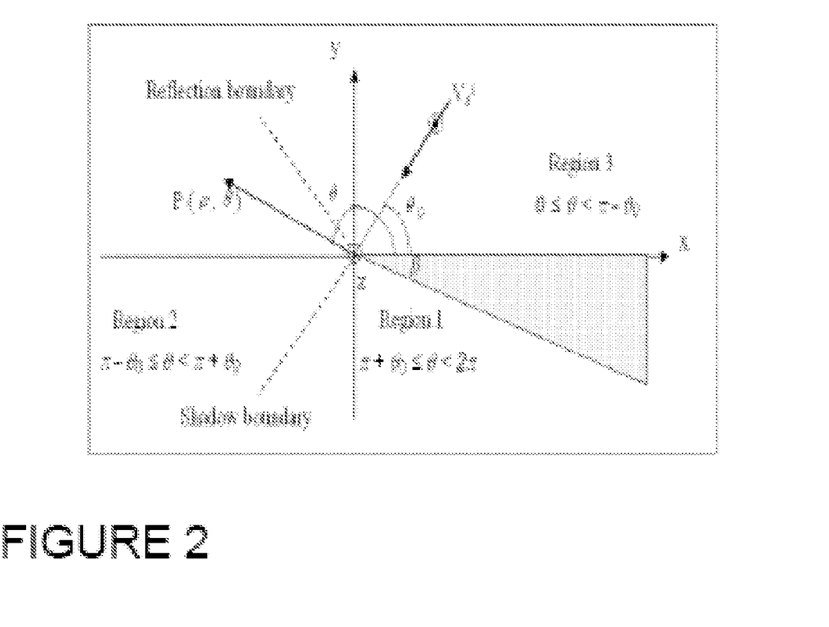
FIG. 2 shows the plane diffraction at a corner of the opaque layer in the openings.

FIG. 2 shows the plane diffraction at a corner of the opaque layer in the openings.

FIG. 2 shows that we have used Geometrical Theory of Diffraction to characterize and analysis the light diffraction phenomenon for different diffraction angle θ for different sidewall angle β.

In FIG. 2, the following are explained:

region 1: region space 1: only diffracted field exist in this region (where β is the side wall angle 31 and Chrome exist in the boundary from 0 to β, so from β to "shadow boundary" is air. Region space 1 consist of Chrome and air) shadow boundary is define by the light path passing from the quartz to the air and shadow edge of the chrome feature blocking the light.

region 2: region space 2 is separated from region 1 by the shadow boundary: geometrical and diffracted field exist.

Region 2 starts from the shadow boundary up to the reflection boundary where air and quartz exist for $2^{nd}$ region of FIG. 1(18) and air only for $1^{st}$ region of FIG. 1 (14))

reflection boundary: The reflection boundary is defined by the path of the reflected light on the interface of the quartz, chrome and air traveling from the quartz towards the air and reflect back into the quartz.

region 3: region space 3 from wedge face separated from region 2 by reflection boundary: incident and reflected wave exist.

Region 3 refers to the region between region 1 and 2. Starts from the reflection boundary to the Chrome and quartz interface.

We are working in region 2 for diffraction angle 180 degrees(θ).

When a plane wave is normally incident upon a corner of the opaque layer in the openings (i.e. incident wavefront is parallel to edge), as shown in FIG. 2, and has a field component $V_z^i$ in the z-direction such that $$V_z^i = \exp\{jk(x \cos \theta_0 + y \sin \theta_0)\} \quad (1)$$

where $\theta_0$ is the angle of incidence to the half-plane. The exact solution for the z-component at any field point $(\rho, \theta)$ (where $\rho$ is the optical distance away from point of diffraction) can be written in compact form as followed:

$$V_z(\rho, \theta) = u^i(\rho, \theta) \mp u^r(\rho, \theta) \quad (2)$$

The upper sign is for electric polarization (TE case) when $V_z^i = E_z^i$ and hence Eq. (2) expresses the total electric field. For the lower sign we have magnetic polarization (TM case) where $V_z^i = H_z^i$ and Eq. (2) now yields the total magnetic field. The superscript i or r indicates that the particular field component is associated with the incident or reflected geometrical optics field. These components in Eq. (2) are given by $$u^{i,r}(\rho, \theta) = U(\epsilon^{i,r}) u_0^{i,r}(\rho, \theta) + u_d^{i,r}(\rho, \theta) \quad (3)$$

where U is the unit step function (1 for $\epsilon > 0$, 0 otherwise), $u_o^{i,r}$ is the geometrical optics field For the geometrical optics field, $$u_o^{i,r}(\rho, \theta) = \exp\{jk\rho\cos(\theta \mp \theta_0 + 2n\pi N)\} \quad (4)$$

$$N = \frac{2\pi - \beta}{\pi} \quad (5)$$

where n is an integer, which satisfies $|\theta \mp \theta_0 + 2Nn\pi| < \pi$ and $\beta$ is the sidewall angle 31.

and $u_d^{i,r}$ is the edge diffracted field $$u_d^{i,r}(\rho, \theta) = -\varepsilon^{i,r} K\{|a^{i,r}|\sqrt{(k\rho)}\}\exp(-jk\rho), \quad (6)$$

$$a^{i,r} = \sqrt{2}\cos\frac{1}{2}(\theta \mp \theta_0),$$

$$\varepsilon^{i,r} = \text{sgn}(a^{i,r}),$$

$$K_{-}(s) = \sqrt{\frac{j}{\pi}}\exp(js^2)\int_s^\infty \exp(-jt^2)dt$$

Away from the optical boundaries and the edge, i.e. at far field ($=10^6\lambda$) or Fraunhofer region, the edge diffraction field can be given in general as:

For TE (electric polarization), $$E_z^d \sim D^e(\theta, \theta_0)\frac{\exp(-jk\rho)}{\sqrt{(8jk\pi)}}, \quad (7)$$

$$H_\theta^d \sim -\sqrt{\frac{\varepsilon}{\mu}}E_z^d$$

$$H_p^d \sim 0$$

For TM (magnetic polarization), $$E_\theta^d \sim \sqrt{\frac{\mu}{\varepsilon}}H_z^d \quad (8)$$

$$E_p^d \sim 0$$

where $D^e(\theta,\theta_0)$ and $D^m(\theta,\theta_0)$ are known as the edge diffraction coefficients, $\mu$ and $\epsilon$ are the permeability and permittivity of medium. In this study, diffraction coefficients derived from the canonical problem are multiplied with the incident ray at the point of diffraction to produce a diffracted field on the diffracted rays.

$$U_d^{e,m} \approx D^{e,m} \cdot V_z^i \quad (9)$$

Away from the optical boundaries and the edge, i.e. at far field ($=10^6\lambda$) or Fraunhofer region, the edge diffraction coefficients for wedge diffraction in general can be approximated by:

$$D^{e,m} = \frac{2}{N}\sin\frac{\pi}{N}\left\{\left(\cos\frac{\pi}{N} - \cos\frac{\theta-\theta_0}{N}\right)^{-1} \mp \left(\cos\frac{\pi}{N} - \cos\frac{\theta+\theta_0}{N}\right)^{-1}\right\} \quad (10)$$

The formulation above allows us to determine the diffracted field for both TE and TM polarization for 180 degree diffraction angle ($\theta_0=180$ deg) using conventional illumination ($\theta=90$ deg) for different sidewall angle $\beta$ (use equation 5 to find out N).

Angle "$\beta$" is the sidewall angle 31 in FIG. 1.

Figure 6A:
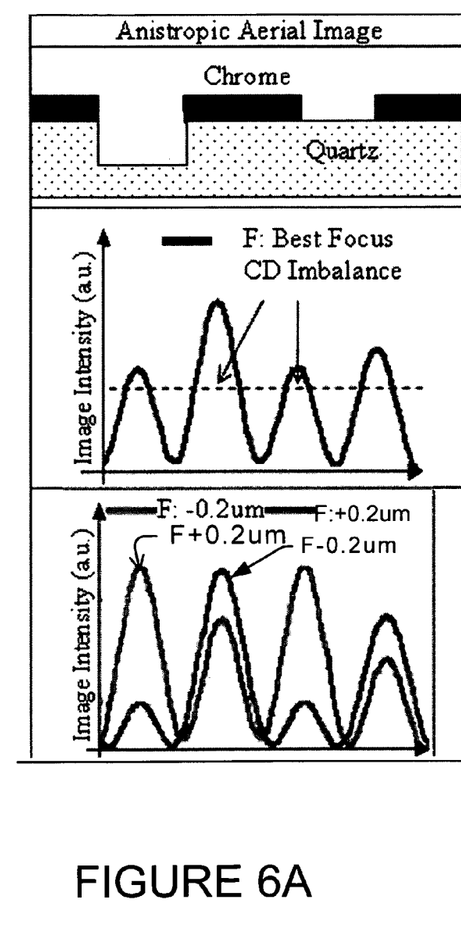

F. Image Intensity Graph Results-FIGS. 6A-6D FIGS. 6A, 6B, 6C and 6D show graphs of (a) image intensity vs location for the best focus and (b) (a) image intensity vs location for the best focus and Focus at −0.2 microns for:

(1) FIG. 6A-*single* trench PSM with straight trench sidewalls. (anisotropic trench etch)

Figure 6B:
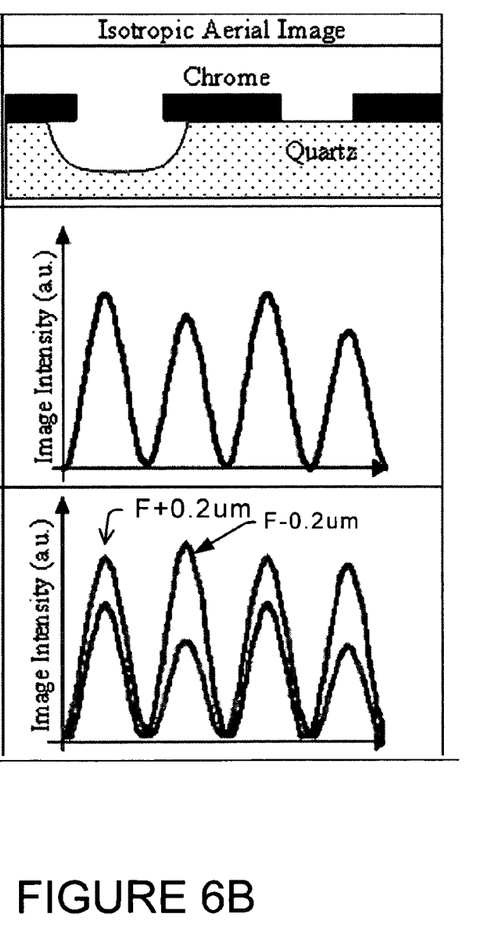

(2) FIG. 6B-*single* trench PSM with curved trench sidewalls. (isotropic trench etch)

Figure 6C:
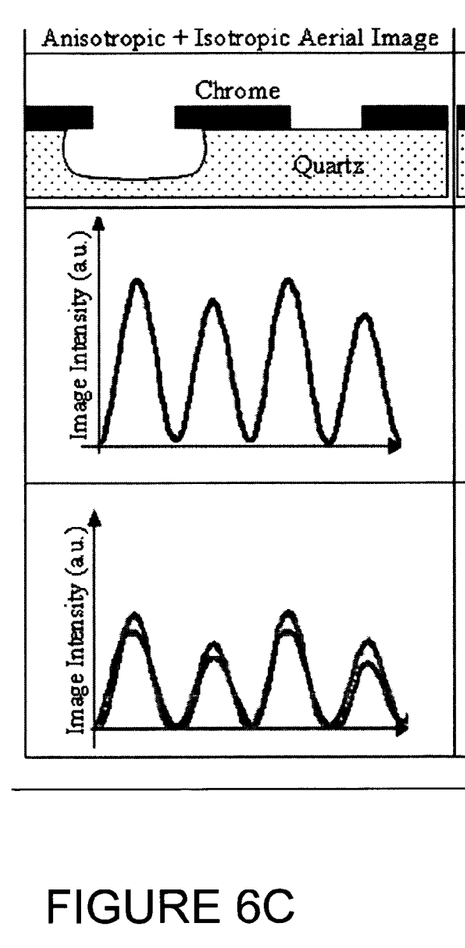

(3) FIG. 6C-*single* undercut trench PSM (anisotropic+isotropic trench etch)

Figure 6D:
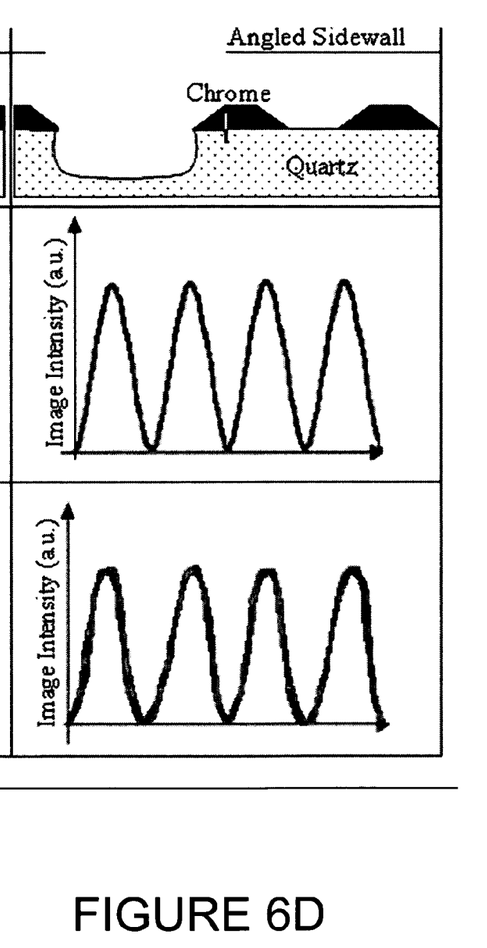

(4) FIG. 6D-*the* embodiment's angled chrome sidewall mask.

FIGS. 6A-6D show that (4) the embodiment's angled chrome sidewall mask produces the most balanced image intensity. The data are postulated and simulated using SOLID-C (a commercial lithography software)

The data for FIGS. 6A and 6b was obtained by simulation

II. Example Method for Forming Sloped Opaque Sidewall

An example embodiment is a method for making a mask that has slope light reducing (e.g., half tone or opaque) sidewalls.

In the description below the light reducing layer 30 is referred to as a opaque layer 30. However, layer 30 can be a light reducing layer 30 such as a opaque or halftone layer 30.

FIGS. 3A to 3G show an example method for forming a mask. A feature is the slanted opaque layer sidewall. The element numbers generally correspond with the analogous elements in FIG. 1.

A. Form an Light Reducing Layer (e.g., Half Tone or Opaque Layer) 30 over a Substrate 10

FIG. 3A shows a cross sectional view of a mask substrate 10. The substrate is preferably comprised of a light transmissive substrate, preferably transparent. The substrate can be comprised of quartz or fused silica.

We form an opaque layer 30 over a substrate 10. The opaque layer is a preferably a light blocking layer is preferably substantially opaque. The opaque layer is preferably comprised of chrome or photoresist and is most preferably comprised of chrome with a thickness between 500 Å and 1000 Å. In an option, an light reducing layer is an opaque layer preferably blocks essentially all light from passing through.

The mask substrate 10 preferably comprises a first region 14, a second region 18 and a third region 22. At least a portion of the third region 22 is positioned between the first region 14 and the second regions 18. The substrate 10 has a first surface that the opaque layer is formed over or on.

Referring to FIGS. 3A and 3B, we pattern the opaque layer to form a first opening 36 over the first region 14 and a second opening 34 over the second region 18. The first opening and the second opening defined by opaque layer sidewalls. The sidewalls of the opaque layer have an initial sidewall angle with the plane of the top surface of the substrate. The sidewall angle is about 90 degrees.

In an example shown in FIG. 3A, a masking layer 32 (e.g., resist) is formed over the opaque layer. Referring to FIG. 3B, the masking layer is patterned to form first and second masking openings. The opaque layer is preferably anisotropically etched using the masking layer 32 as a mask to form the first opening 36 over the first region 14 and a second opening 34 over the second region 18.

The patterns in the masking layer are typically formed utilizing some mask writing tool. An example writing tool comprises the ETEC MEBES 4500, available from ETEC Systems, Inc, of Hillsboro, Oreg.

The chrome pattern 30 can be used to define a desired circuit pattern of a semiconductor device.

FIG. 3C shows the step of removing the resist layer 32.

B. Form a First Trench 40 in the First Region

Referring 3D, we form a first trench resist layer 38 over at least the second region 18. The first trench resist layer 38 has an opening as least over the first region 14.

Referring to FIG. 3E, we form a first trench 40 in the first region preferably using the first trench resist layer 38 as an etch mask. The trench can be etching using a anisotropic etch such as dry-etch process using $CHF_3 + H_2$ plasma under certain process conditions.

C. Etch the Opaque Layer Sidewalls to Make the Sidewall Angle Less than 90 Degrees Next, we reform the opaque layer sidewalls to make the sidewall angle less than 90 degrees.

Referring to an example in FIG. 3F, we preferably etch the opaque layer sidewalls to make the sidewall angle 31 less than 90 degrees.

The sidewall angle 31 is between 30 and 60 degrees and is more preferably between 30 and 60 degrees.

The sidewalls are preferably etched with $SF_6$ dry etch.

The $SF_6$ etch etches the sidewall to have a straight slope by using proper balancing of RF power, etchant gases and temperature.

The (e.g., $SF_6$) etch preferably does not significantly etch the trench 40 any deeper.

The tip of the light reducing layer 30 where the slope edge meets the bottom, can be a shape tip or a rounded tip. Our simulation results show good image intensity balance performance for sharp tip. Ideally, the shape of the tip of the chrome wedge must be sharp. However in real mask fabrication, there will be small rounding at the tip, which is still acceptable.

D. Isotropic Quartz Wet Etching

Referring to FIG. 3G, we preferably etch the substrate in the first and second regions. The etch is preferably an isotropic quartz wet etch such as a wet etch. The etch is to provide a smoother topography of the trenches 40 44.

Note that the isotropic etch forms a second trench 44 in the second region 18 and makes the first trench 40 deeper.

The $^2$nd trench 44 is optional.

Preferably at this point, light transmitted thru the first region 14 and the second region 18 are about 180 degrees out of phase.

FIG. 3G shows sidewalls 36A and 34B of opquage layer 30.

Isotropic wet etch will give a smooth-surfaced curved shape because the etch rate is uniform—as each point of the surface is removed at the same rate. For feature with corner, a curved surface will result from the corner feature. For anisotropic etch, it is a directional controlled by the RF power, etchant gases, timing and temperature. Hence a straight sidewall can be achieved.

III. Supporting Data—FIGS. 4A 4B 5A and 5B

The following variables are used in FIGS. 4A, 4B, 5A and 5B. β has been defined as the chrome sidewall angle 31, has been defined in equation (9).

We see that the most possible diffraction angle for optical interference between two nearest feature edges is 180°. At 180° diffraction angle, the optical path for any two nearest feature edges is the shortest.

Figure 4A:
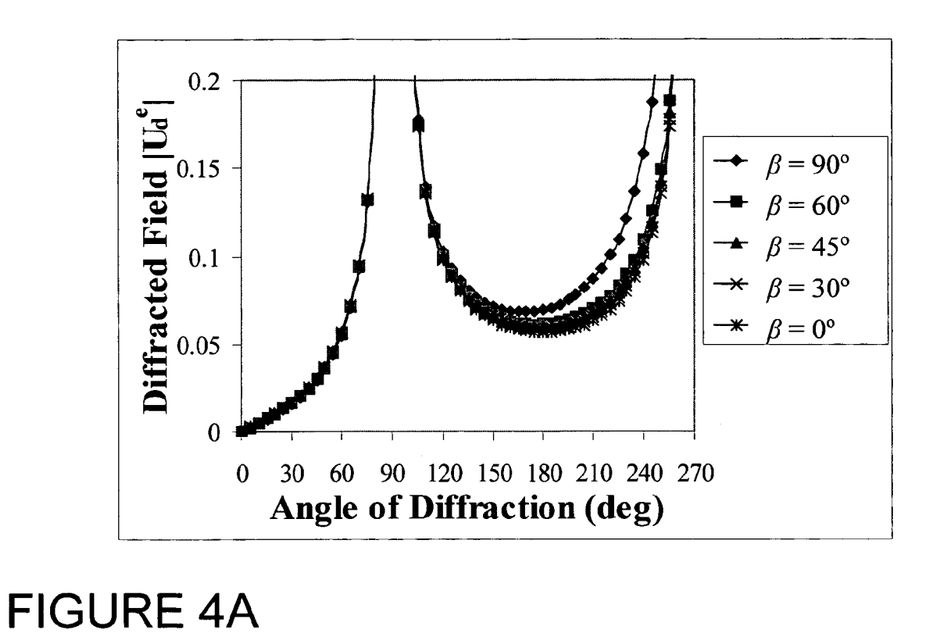
FIGS. 4A and 4B shows graphs of diffraction field vs angle of diffraction for a range of sidewall angles according to an example embodiment of the present invention.

FIG. 4A shows normalized diffracted field $|U_d^e|$ for E-polarization for different N. We determine that $D^e$ for N=1.5 (90° wedge, i.e. square chrome block) is the highest among other $|U_d^e|$ from 120° diffraction angle onwards. This shows that 90° wedge (e.g., chrome sidewall angle 31 is 90 degrees) is more prone to optical interference than angled wedge. We can conclude from FIG. 4A the following to minimize or eliminate the undercut that can cause chrome peeling, we can adopt a suitable amount of sidewall angle β to achieve balanced aerial image. This shows that a 90° wedge is more prone to optical interference than an angled wedge.

Figure 4B:
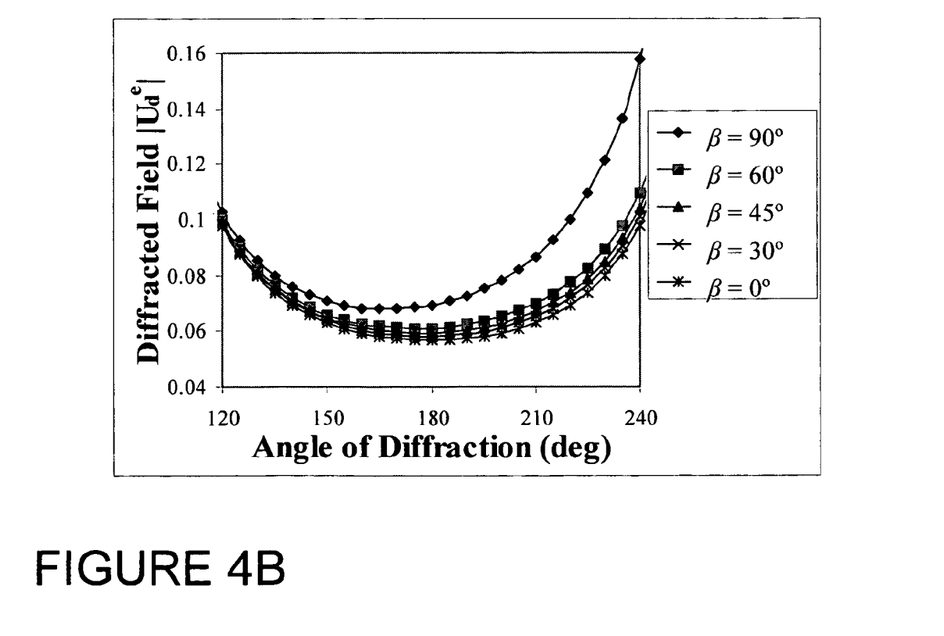

FIG. 4B shows the closed-up view of normalized diffracted field $|U_d^e|$ for E-polarization for different N at 180°. We can conclude from FIG. 4B the following: adopting a suitable amount of sidewall angle 31, we can reduce the diffracted field at 180 deg diffraction angle to close to zero in an effort to reduce the interference between the 2 corners, regardless of the interference will be constructive or destructive.

Figure 5A:
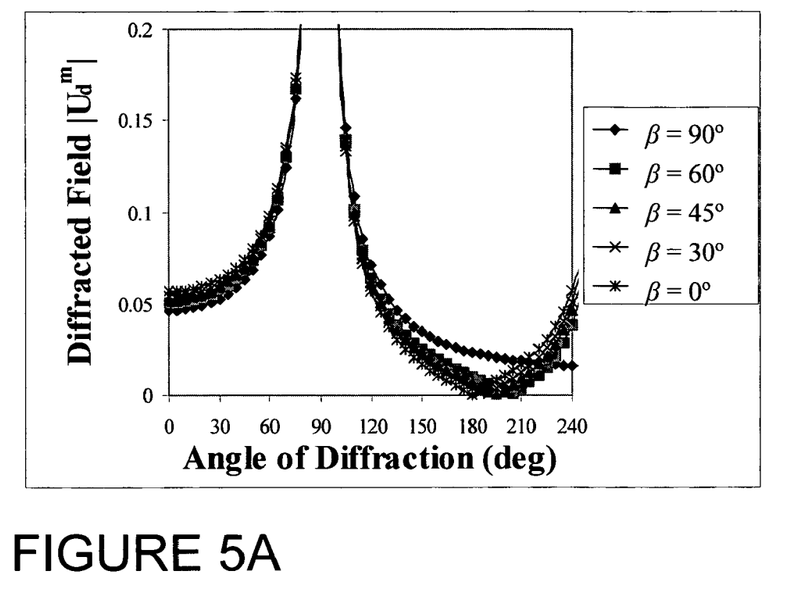
FIGS. 5A and 5B shows graphs of diffraction field vs angle of diffraction for a range of sidewall angles according to an example embodiment of the present invention.

FIG. 5A shows normalized diffracted field $|U_d^m|$ for H-polarization for different N. We see that $|U_d^m|$ for angled wedges have zero or small optical interference than square wedge for diffraction angle~180° to 200°. We see that the $D^m$ value for an angled wedge have zero or small optical interference compared to a square wedge at diffraction angle of 180° to 200°. At a diffraction angle of 180°, the optical path between nearest feature edges is the shortest and constructive or destructive interference cannot be isolated or distinguished. Nevertheless, we can reduce the diffracted field to minimize or eliminate the amount of undercut.

Figure 5B:
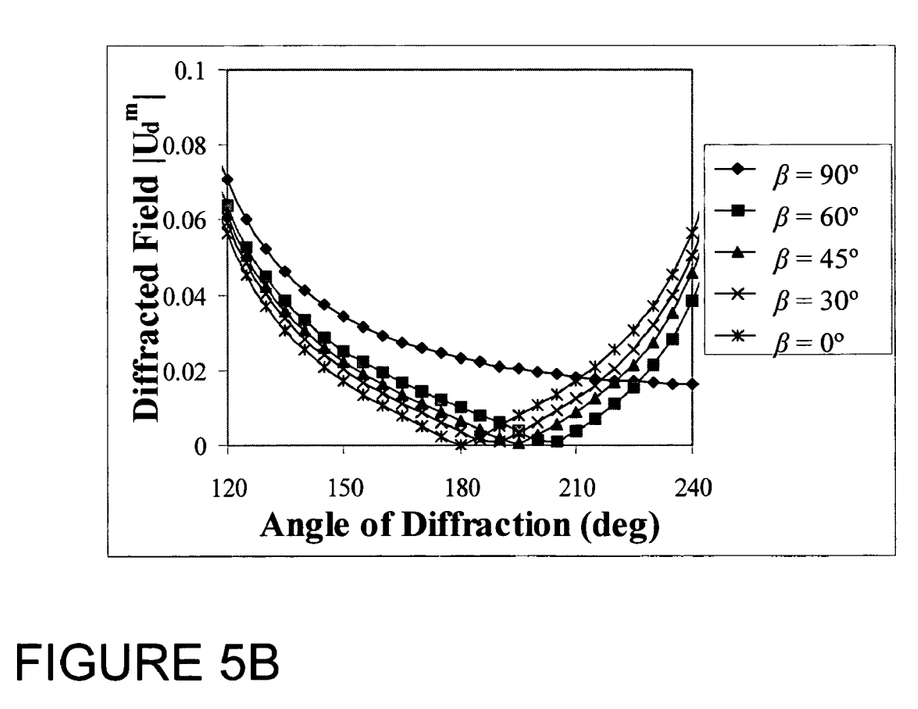

FIG. 5B shows the closed-up view of normalized diffracted field $|U_d^m|$ for H-polarization for different N at 180°. We can reduce the diffracted field to minimize the amount of undercut. Hence, the angled wedge can be optimized (for an angle β) for different pitch ratio for same amount of interference (intensity balance) at 0-degree and 180-degree etched quartz. The results obtained suggest that a novel design for a phase shift mask with an arbitrary angled wedge on the chrome face is feasible.

A. Optional Data Biasing

The embodiment's sloped opaque sidewall is preferably implemented in an alternating phase shift mask. This sloped sidewall can be combined with shifter width biasing. That is the width of the first and second openings can be Biased (e.g., made smaller or larger) from the initial design sizes to improve the mask performance. Shifter width biasing refers to enlarge of the quartz opening to allow more light to pass through. E.g., the term 90 nm bias on mask refers to sizing up the quartz opening by 45 nm larger per edge.

For example, the PSM image imbalance correction can be implemented through the application of shifter width biasing combined with the best taper-angle wedge chrome-face wall.

The embodiment includes data biasing a determined desired circuit pattern. The data biasing might be done empirically, by trial and error, by using commercially available software such as Tempest available from Panoramic Technology of Berkeley, Calif., using other software, or by some combination of these. All of this by itself could constitute prior art methods, or yet to be developed methods for data biasing. In one implementation, an initial data bias circuit pattern to be used in forming the ultimate desired circuit pattern on some substrate may, at least initially, IV. Example Embodiments of Other Mask Types Using the Slope Sidewall Opaque Layer The sloped sidewall be used in any other type masks. For example, in addition to the alt-PSM single and double trench (no undercut) mask, the embodiment slope sidewall chrome pattern can be used on the masks shown in FIGS. 7A to 7D.

Figure 7A:
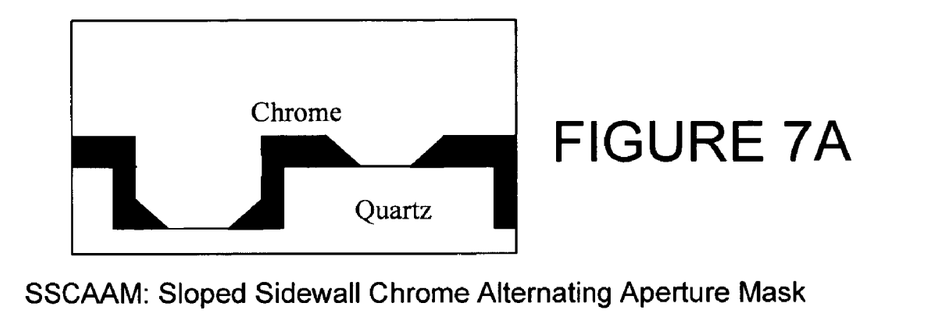
FIG. 7A shows SSCAAM: Sloped Sidewall Chrome Alternating Aperture Mask using the embodiment sloped sidewall opaque layer according to an example embodiment of the present invention.

FIG. 7A shows SSCAAM: Sloped Sidewall Chrome Alternating Aperture Mask using the embodiment sloped sidewall opaque layer.

Figure 7B:
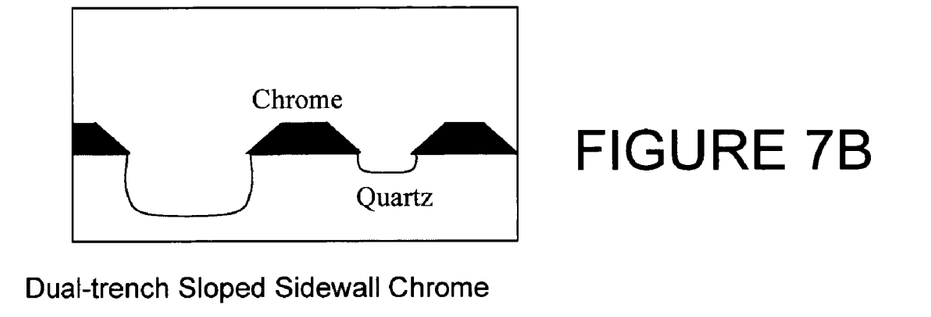
FIG. 7B shows a Dual-trench Sloped Sidewall Chrome using the embodiment sloped sidewall opaque layer according to an example embodiment of the present invention.

FIG. 7B shows a Dual-trench Sloped Sidewall Chrome using the embodiment sloped sidewall opaque layer.

Figure 7C:
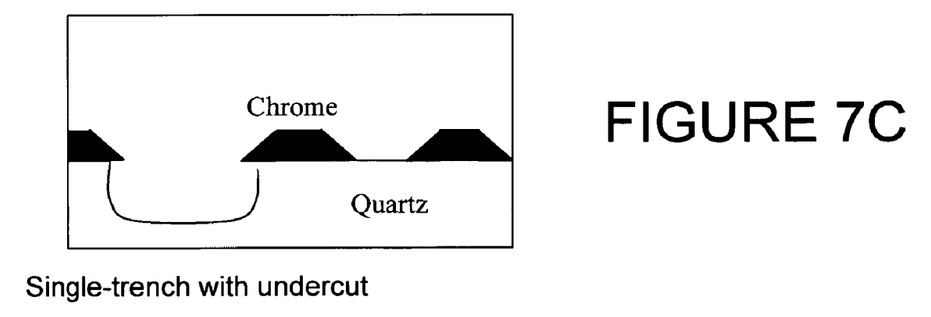
FIG. 7C shows Single-trench with undercut using the embodiment sloped sidewall opaque layer according to an example embodiment of the present invention.

FIG. 7C shows Single-trench with undercut using the embodiment sloped sidewall light reducing layer.

Figure 7D:
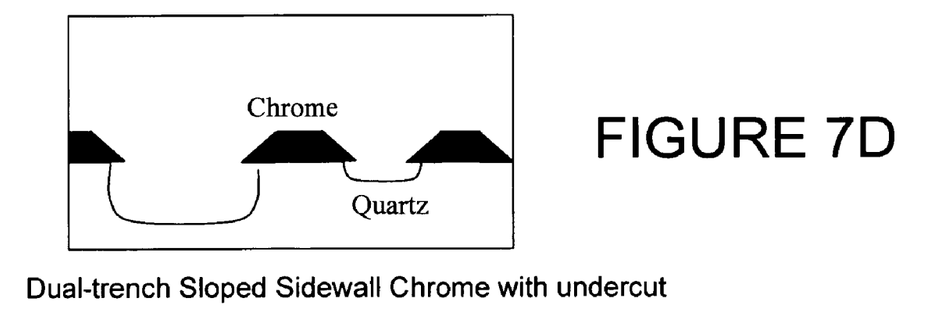
FIG. 7D shows a double trench Sloped Sidewall Chrome with undercut according to an example embodiment of the present invention.

FIG. 7D shows a double trench Sloped Sidewall Chrome with undercut using the embodiment.

It is possible to implement the slope sidewall opaque layer on other type masks and the embodiment is not limited to the mask described above.

A. Additional Example Embodiments

In an example embodiment, a mask with an half tone layer with sloped sidewalls can be formed. That is for all the above embodiments, the chrome layer can be replaced by a half tone layer. The monitoring equations for the for the impedance wedge can be found in Graeme L. James,"Geometrical theory of diffraction for electromagnetic waves", IEE Electromagnetic Waves Series, Institution of Electrical Engineers P. Peregr/1986-11-01 ISBN: 0863410626.

The example embodiment's mask could be a half tone PSM mask where the half tone layer has sloped sidewalls.

Another example embodiment mask can be a binary mask where some of the chrome edges (that define the openings) have sloped sidewalls.

Another example embodiment mask can be a rim shift PSM with sloped sidewalls.

Another example embodiment mask can be a outrigger PSM with sloped sidewalls.

B. Other Possible Shaped of the Slated Chrome Sidewall

The sloped (chrome) sidewall can have a rounded shaped (or non-planar or non-linear shape. For example, the sloped chrome sidewall can have a slight non-planar shape due to mask fabrication process. We can take these shapes of the slated chrome sidewall into consideration.

Figure 8A:
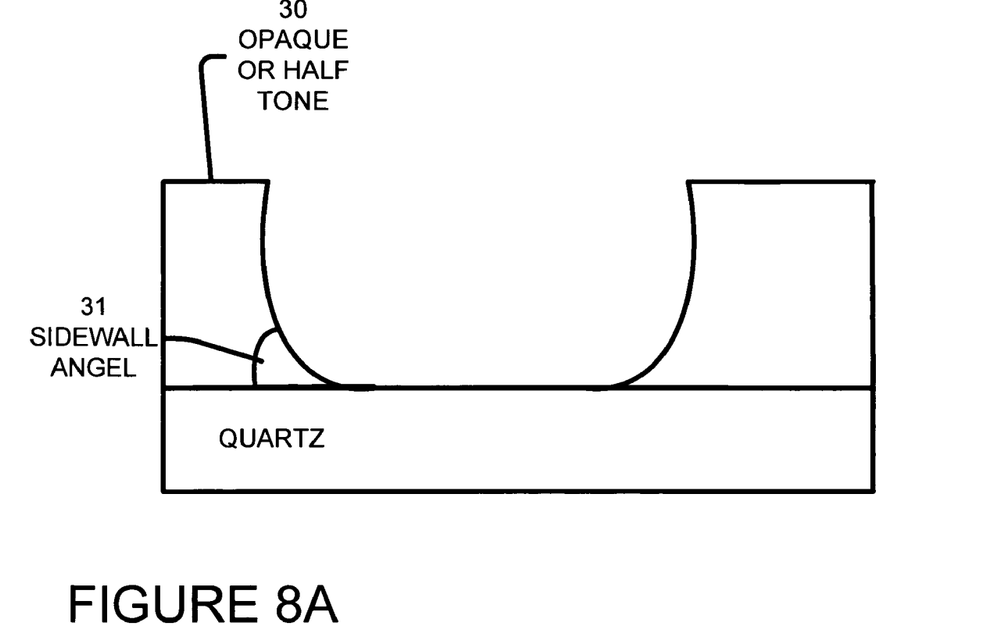
FIG. 8A shows an example of a curved sloped sidewall light reducing layer according to an example embodiment of the present invention.

FIG. 8A shows an example of a rounded or curved shaped sidewall.

Figure 8B:
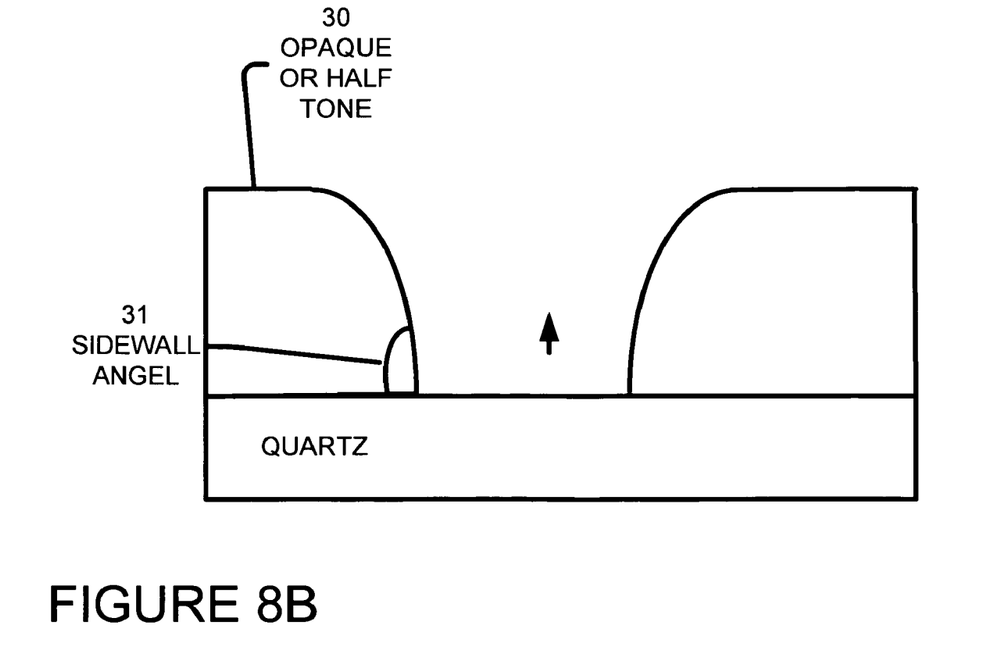
FIG. 8B shows another example of a curved sloped sidewall light reducing layer according to an example embodiment of the present invention.

FIG. 8B shows another example of a convex or curved sloped chrome sidewall. The sloped chrome sidewall can have a slight non-planar shaped due to mask fabrication process.

A curved chrome sidewall can achieve a smaller sidewall angle 31 easier (in terms of mask fabrication) than a straight slanted chrome sidewall.

C. Non-Limiting Example Benefits

Some of the example embodiment can have some of the advantages:
- PSM image imbalance correction can be implemented through the application of shifter width biasing combined with the best taper-angle wedge chrome-face wall.
- Even a moderated amount of taper-angle helps to partially reduce the image imbalance.
- Through-focus imbalance magnitude is insensitive to shifter biasing, but an optimal shifter bias makes it symmetric around best focus.
- Therefore, shifter bias of 90 nm coupled with angled-wedge chrome-face wall can solve image imbalance without excessive undercuts.

D. Non-Limiting Example Embodiments

Given the variety of embodiments of the present invention just described, the above description and illustrations show not be taken as limiting the scope of the present invention defined by the claims.

If advantageously needed in embodiments described above, the invention will be divided into a plurality of sections and embodiments and be explained. And, except for particularly specifying cases, they have nothing to do with one another but one of them has something to do with modifications, detailed explanation, supplementary explanation, or the like relative to one portion or entire of the other.

Further, in the embodiments described above, except for a case of citation of number of elements or the like (containing number of elements, a numerical value, a quantity, a numerical range or the like), a case of particular specification, a case of limit to specific numbers positively and in principle, and the like, the present invention is not limited to the specific number and may be more than or less than or equal to the specific number.

Further, in the embodiments described above, it goes without saying that components (including processing steps or the like) thereof is not always indispensable to the present invention except for a case of particular specification and a case of what is thought of as indispensable positively and in principle, and the like.

Similarly, in the embodiment described above, cases of citation of shapes of components or the like, or/and positional relationships or the like include something that is in fact close or similar to the shapes or the like except for a case particular specification, and a case of what is not thought of as indispensable positively and in principle, and the like. This is also the same about the above-mentioned numeral values and ranges.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for forming a phase shift mask comprising:
   providing a substrate comprising a transparent material having first, second and third regions, the third region being disposed between the first and second regions;
   forming a light reducing layer on a first major surface of the substrate:
   patterning the light reducing layer to form a patterned light reducing layer having sidewalls defining openings to expose the first and second regions;
   processing the patterned light reducing layer to transform the sidewalls of the pattered light reducing layer to angled sidewalls having an angle of less than 90° from a plane of the first major surface of the substrate, wherein the angled sidewalls improve intensity balance of an image formed by light transmitted through the mask.

2. The method of claim 1 wherein the light reducing layer comprising an opaque layer.

3. The method of claim 1 wherein the light reducing layer comprising a half tone layer.

4. The method of claim 1 wherein the sidewall angle is between 30 and 60 degrees.

5. The method of claim 1 which further includes forming a first trench in the first region of the substrate, wherein said first trench extends under the light reducing layer.

6. The method of claim 1 which further includes forming a first trench in said first region and forming a second trench in said second region of the substrate.

7. The method of claim 1 which further includes forming first and second trenches in said first and second regions of the substrate respectively; said first trench and said second trench extend under the light reducing layer.

8. The method of claim 1 which further includes forming first and second openings with open dimensions that are biased smaller or larger from initial design sizes.

9. The method of claim 1 wherein no phase shifting layer is formed over the patterned light reducing layer.

* * * * *